(12) United States Patent
Wu et al.

(10) Patent No.: US 9,356,179 B2
(45) Date of Patent: May 31, 2016

(54) DISPLAY PANEL INTEGRATED WITH PHOTOELECTRIC DEVICE

(71) Applicant: Industrial Technology Research Institute, Hsinchu (TW)

(72) Inventors: Ming-Hsien Wu, Tainan (TW); Chia-Hsin Chao, Taichung (TW); Yen-Hsiang Fang, New Taipei (TW); Yi-Chen Lin, Taipei (TW); Ying-Chien Chu, Tainan (TW); Mu-Tao Chu, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 14/586,847

(22) Filed: Dec. 30, 2014

(65) Prior Publication Data

US 2015/0108508 A1 Apr. 23, 2015

Related U.S. Application Data

(63) Continuation-in-part of application No. 13/923,376, filed on Jun. 21, 2013, now Pat. No. 8,981,391.

(60) Provisional application No. 61/662,931, filed on Jun. 22, 2012.

(30) Foreign Application Priority Data

May 31, 2013 (TW) .............................. 102119355 A

(51) Int. Cl.
*H01L 33/00* (2010.01)
*H01L 31/173* (2006.01)
(Continued)

(52) U.S. Cl.
CPC .............. *H01L 31/173* (2013.01); *G02F 1/157* (2013.01); *H01L 27/3227* (2013.01);
(Continued)

(58) Field of Classification Search
CPC .................. H01L 2251/5323; H01L 27/3211; H01L 27/3246
USPC ................................................. 257/88, 89, 91
See application file for complete search history.

(56) References Cited

U.S. PATENT DOCUMENTS

| 4,306,716 | A | 12/1981 | James et al. |
| 8,314,859 | B2 | 11/2012 | Kim et al. |

(Continued)

FOREIGN PATENT DOCUMENTS

| CN | 102130148 | 7/2011 |
| TW | 201007258 | 2/2010 |

(Continued)

OTHER PUBLICATIONS

Yoon et al., "GaAs photovoltaics and optoelectronics using releasable multilayer epitaxial assemblies", Nature, May 20, 2010, vol. 465, p. 329-p. 334.

(Continued)

*Primary Examiner* — Matthew E Warren
(74) *Attorney, Agent, or Firm* — Jianq Chyun IP Office

(57) ABSTRACT

A display panel comprising a substrate, a meshed shielding pattern, a plurality of light-emitting devices and a solar cell is provided. The substrate has a first surface and a second surface opposite to the first surface, the substrate comprises a first circuit layer disposed over the first surface and a second circuit layer disposed over the second surface. The meshed shielding pattern is disposed on first surface of the substrate to define a plurality of pixel regions over the substrate. The light-emitting devices are disposed on the first surface of the substrate and electrically connected to the first circuit layer, and at least one of the light-emitting devices is disposed in one of the pixel regions. The solar cell is disposed on the second surface of the substrate and electrically connected to the second circuit layer.

20 Claims, 7 Drawing Sheets

(51) Int. Cl.
*G02F 1/157* (2006.01)
*H01L 27/32* (2006.01)
*H01L 51/52* (2006.01)
*G02F 1/133* (2006.01)

(52) U.S. Cl.
CPC ....... H01L 27/3272 (2013.01); H01L 27/3283 (2013.01); *G02F 2001/13324* (2013.01); *G02F 2201/44* (2013.01); *H01L 27/322* (2013.01); *H01L 27/3209* (2013.01); *H01L 27/3211* (2013.01); *H01L 27/3232* (2013.01); *H01L 27/3246* (2013.01); *H01L 51/5284* (2013.01); *H01L 2251/5323* (2013.01)

(56) References Cited

U.S. PATENT DOCUMENTS

| | | | |
|---|---|---|---|
| 8,319,419 | B2 | 11/2012 | Kodama et al. |
| 8,659,724 | B2 | 2/2014 | Hagiwara et al. |
| 2004/0201548 | A1* | 10/2004 | Watanabe ................. G09G 3/20 345/30 |
| 2009/0295943 | A1 | 12/2009 | Kim et al. |
| 2010/0314616 | A1 | 12/2010 | Kodama et al. |
| 2011/0147770 | A1 | 6/2011 | Hwang et al. |
| 2013/0038921 | A1 | 2/2013 | Kim et al. |
| 2013/0106813 | A1* | 5/2013 | Hotelling ............. G06F 1/3265 345/207 |
| 2013/0229357 | A1* | 9/2013 | Powell .................. G06F 3/0412 345/173 |

FOREIGN PATENT DOCUMENTS

| | | |
|---|---|---|
| TW | M412373 | 9/2011 |
| TW | 201142455 | 12/2011 |

OTHER PUBLICATIONS

Nguyen, "Challenges in the design of a RGB LED display for indoor applications", Synthetic Metals, Feb. 28, 2001, vol. 122, p. 215-p. 219.

Onoe et al., "Temperature-controlled transfer and self-wiring for multi-color light-emitting diode arrays", Journal of Micromechanics and Microengineering, Jun. 23, 2009, vol. 19, p. 1-p. 9.

Jang et al., "Toward Flexible Transparent Plasma Display: Optical Characteristics of Low-Temperature Fabricated Organic-Based Display Structure", IEEE Electron Device Letters, Jan. 2012, vol. 33, p. 74-p. 76.

Kim et al., "Transparent driving thin-film transistor circuits based on uniformly grown single-walled carbon nanotubes network ", Device Research Conference 2009, Jun. 22-24, 2009, p. 117-p. 118.

Park et al., "Printed Assemblies of Inorganic Light-Emitting Diodes for Deformable and Semitransparent Displays" with the supporting material therefor, Science, Aug. 20, 2009, vol. 325, p. 1-p. 51.

* cited by examiner

US 9,356,179 B2

DISPLAY PANEL INTEGRATED WITH PHOTOELECTRIC DEVICE

CROSS-REFERENCE TO RELATED APPLICATION

This application is a continuation-in-part application of and claims the priority benefit of a prior application Ser. No. 13/923,376, filed on Jun. 21, 2013, now allowed. The prior application Ser. No. 13/923,376 claims the priority benefits of U.S. provisional application Ser. No. 61/662,931, filed on Jun. 22, 2012 and Taiwan application serial no. 102119355, filed on May 31, 2013. The entirety of each of the above-mentioned patent applications is hereby incorporated by reference herein and made a part of this specification.

TECHNICAL FIELD

The disclosure relates to a display panel having improvements in reliability or power consumption.

BACKGROUND

The transparent display is a display having a certain degree of inherent transparency, wherein in addition to displaying information or pictures, the transparent display further allows the user to clearly see the background behind the display. Currently, the transparent display is suitable for various applications in, for instance, windows of buildings, car windows, and shop windows, and has therefore garnered market attention.

However, the current transparent display faces problems such as not having enough transparency and difficulty in displaying deep color. If the transparency of the display is low, the user will clearly perceive the presence of the display and not be able to clearly observe the background behind the display. Moreover, when the average display displays deep color, the deep color pixel regions display lower luminance. However, for the transparent display, if the luminance displayed by the deep color pixel regions is lower, the background behind the pixel regions becomes easily observed. Therefore, the transparent display has the prevalent problem of poor deep color display due to difficulty in grayscale control.

SUMMARY

The disclosure provides a display panel having improved reliability and lowered power consumption.

The disclosure provides a display panel comprising a substrate, a meshed shielding pattern, a plurality of light-emitting devices and a solar cell. The substrate has a first surface and a second surface opposite to the first surface, the substrate comprises a first circuit layer disposed over the first surface and a second circuit layer disposed over the second surface. The meshed shielding pattern is disposed on first surface of the substrate to define a plurality of pixel regions over the substrate. The light-emitting devices are disposed on the first surface of the substrate and electrically connected to the first circuit layer, and at least one of the light-emitting devices is disposed in one of the pixel regions. The solar cell is disposed on the second surface of the substrate and electrically connected to the second circuit layer.

The disclosure provides another display panel comprising a substrate, a meshed shielding pattern and a plurality of light-emitting devices. The substrate comprises a circuit layer. The meshed shielding pattern is disposed on the substrate to define a plurality of pixel regions over the substrate. The light-emitting devices are disposed on the substrate and electrically connected to the circuit layer, and at least one of the light-emitting devices is disposed in one of the pixel regions. The meshed shielding pattern is capable of converting light emitted from the light-emitting devices into photocurrent.

The disclosure further provides a display panel comprising a substrate, a meshed shielding pattern and a plurality of light-emitting devices. The substrate comprises a circuit layer and a plurality of photo-sensors. The meshed shielding pattern is disposed on the substrate to define a plurality of pixel regions over the substrate. The light-emitting devices are disposed on the substrate and electrically connected to the circuit layer, and at least one of the light-emitting devices is disposed in one of the pixel regions. The photo-sensors are capable of detecting light emitted from the light-emitting devices to monitor light output of the light-emitting devices.

The disclosure further provide another display panel comprising a substrate, a meshed shielding pattern, a dielectric layer, a plurality of light-emitting devices and a touch-sensing layer. The substrate comprises a circuit layer. The meshed shielding pattern is disposed on the substrate to define a plurality of pixel regions over the substrate. The dielectric layer is filled in the pixel regions. The light-emitting devices are disposed on the substrate and electrically connected to the circuit layer, at least one of the light-emitting devices is disposed in one of the pixel regions, and the light-emitting devices are encapsulated by the dielectric layer. The touch-sensing layer is disposed over the dielectric layer and the light-emitting devices.

Based on the above, power consumption of the display panel having a solar cell integrated therein is lowered. Additionally, reliability of the display panel having photo-sensors integrated therein is enhanced.

To make the above features and advantages of the disclosure more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DETAILED DESCRIPTION OF DISCLOSED EMBODIMENTS

First Embodiment

Figure 1:
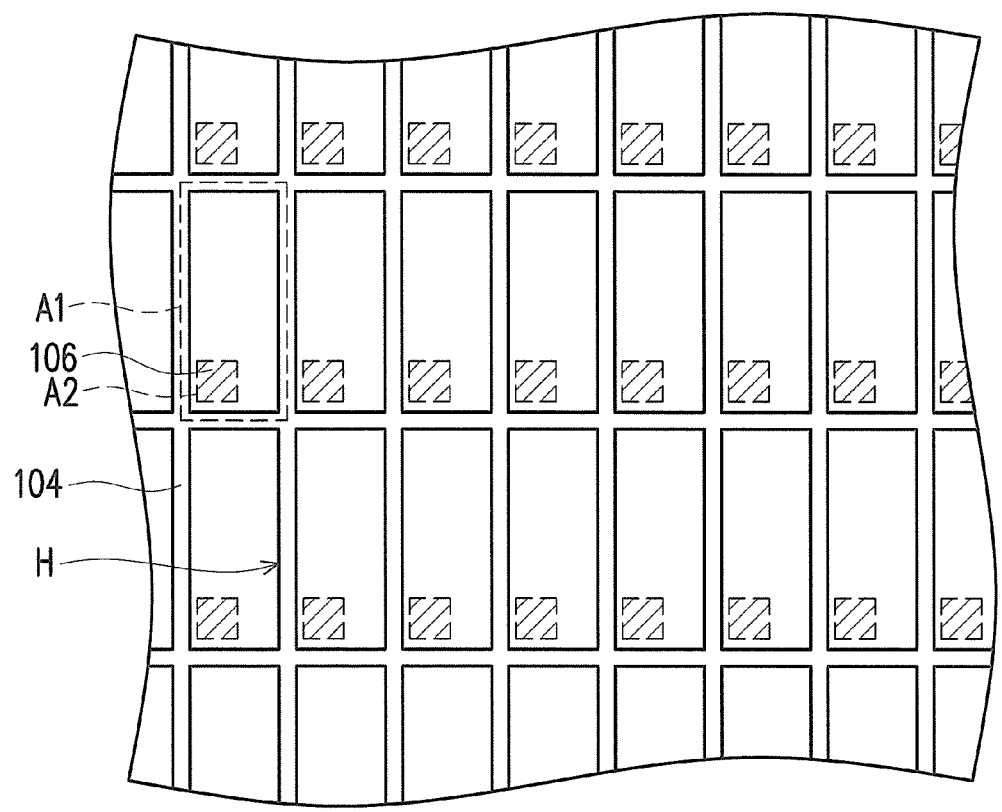
FIG. 1 is a schematic top view of a portion of a display panel of the first embodiment of the disclosure.
Figure 2A:
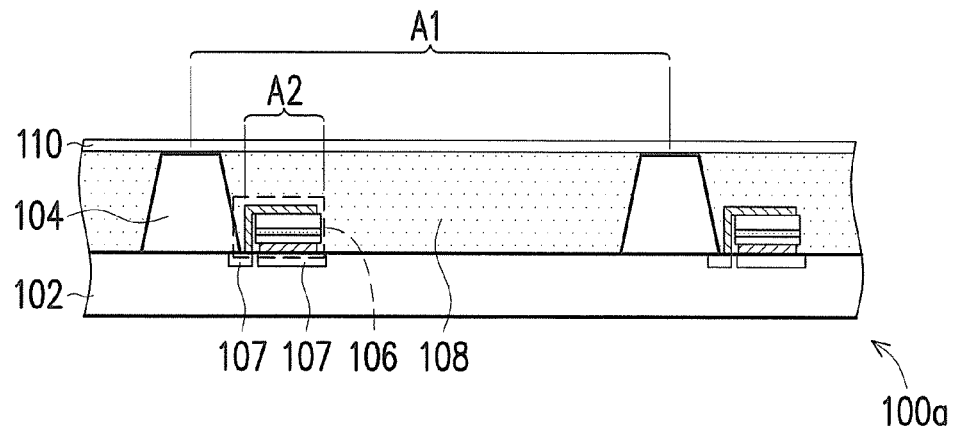
FIG. 2A is a schematic cross-sectional view of a portion of a display panel of the first embodiment of the disclosure.

FIG. 1 is a schematic top view of a portion of a display panel of the first embodiment of the disclosure. FIG. 2A is a schematic cross-sectional view of a portion of a display panel 100a of the first embodiment of the disclosure. Referring to FIG. 1 and FIG. 2A, the display panel 100a includes a substrate 102, a meshed shielding pattern 104, and a plurality of light-emitting devices 106.

The substrate 102 is a transparent substrate. Specifically, the transparent substrate indicates the substrate has a light transmittance above a certain degree, and the higher the light transmittance, the higher the transparency of the substrate. The substrate 102 may be a rigid substrate or a flexible substrate. The material of the rigid substrate is, for instance, glass, quartz, or silicon wafer. The material of the flexible substrate is, for instance, plastic. Moreover, a designed circuit layer 107 may first be disposed on the substrate 102 based on a desired layout for a component to be subsequently disposed on the substrate 102. The circuit layer 107 may be on the surface of the substrate 102 and may also be integrated into the interior of the substrate 102.

The meshed shielding pattern 104 is disposed on the substrate 102. The meshed shielding pattern 104 has a grid structure so as to define a plurality of pixel regions U on the substrate 102. In other words, the meshed shielding pattern 104 has, for instance, a plurality of openings H, wherein each opening H of the openings exposes one pixel region U of the pixel regions U. The material of the meshed shielding pattern 104 may be, for instance, an organic polymer material, a photoresist, a metal, a dielectric material, an oxide, or a semiconductor.

The light-emitting devices 106 are disposed on the substrate 102. At least one light-emitting device 106 of the light-emitting devices may be disposed in each pixel region U of the pixel regions U. The present embodiment is exemplified by disposing one light-emitting device 106. The light-emitting device 106 may be a light-emitting diode (LED), an organic light-emitting diode (OLED), or other suitable light-emitting devices.

Figure 2B:
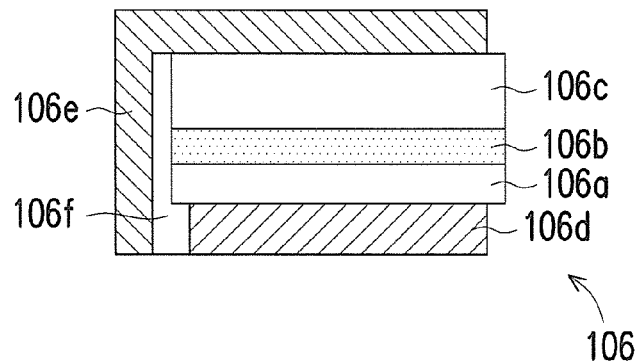
FIG. 2B is an enlarged schematic view of a light-emitting device of FIG. 2A.

FIG. 2B is an enlarged schematic view of the light-emitting device 106 of FIG. 2A, wherein the light-emitting device 106 is exemplified by a light-emitting diode. Referring to FIG. 2B, the light-emitting device 106 includes a first semiconductor layer 106a, a light-emitting layer 106b, a second semiconductor layer 106c, a first electrode 106d, a second electrode 106e, and an insulation layer 106f, wherein the light-emitting device 106 is, for instance, electrically connected to the circuit layer 107 on the substrate 102 through the first electrode 106d and the second electrode 106e. The structure of the light-emitting device 106 is known to those skilled in the art and is therefore not described herein.

Referring to FIG. 1 and FIG. 2A, an area occupied by each pixel region U of the pixel regions U is about 400 $\mu m^2$-1 $mm^2$. An area A2 occupied by each light-emitting device 106 of the light-emitting devices 106 is about 100 $\mu m^2$-0.1 $mm^2$, wherein the light-emitting devices 106 are substantially devices having lower light transmittance and therefore have low transparency. The regions occupied by the area A1 and the area A2 are as shown in FIG. 1. In the present embodiment, a ratio of A2 to A1 is below 50%. In other words, in each pixel region U of the pixel regions U, the area A2 occupied by the light-emitting device 106 having low transparency is only less than 50% of the area A1 of the pixel region U. Therefore, most of the areas of the pixel regions U may maintain high light transmittance, thus increasing the transparency of the display panel 100a. In another embodiment, the ratio of A2 to A1 is 0.01%-25%.

The display panel 100a further includes a diffusion adhesive 108. In the present embodiment, the diffusion adhesive 108 is disposed in the pixel regions U and covers the light-emitting devices 106. The diffusion adhesive 108 is, for instance, formed by dispersing a plurality of diffusion particles in transparent colloids. The diffusion particles in the diffusion adhesive 108 may help to transmit the light of the light-emitting devices 106 throughout the pixel regions U. Therefore, the function of light transmission of the diffusion adhesive 108 may facilitate a more uniform luminance in the entirety of the pixel regions U.

The display panel 100a further includes a cover layer 110. The cover layer 110 covers the meshed shielding pattern 104 and the diffusion adhesive 108. The cover layer 110 may be used to protect each device in the display panel 100a to lower the probability of damage to the display panel 100a.

Other embodiments are listed below for explanation, wherein the same reference numerals represent the same or similar components. Moreover, the top schematic views of the following number of embodiments are as shown in FIG. 1.

Second Embodiment

Figure 3:
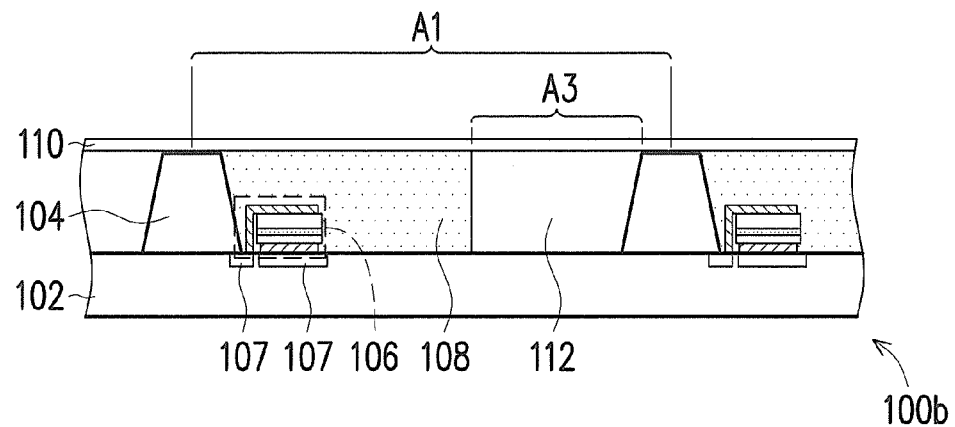
FIG. 3 is a schematic cross-sectional view of a portion of a display panel of the second embodiment of the disclosure.

FIG. 3 is a schematic cross-sectional view of a portion of a display panel of the second embodiment of the disclosure. Referring to FIG. 1 and FIG. 3, the display panel 100b is substantially similar to the display panel 100a of FIG. 2A, wherein the difference between the two is that the display panel 100b further includes an optical adhesive 112. The optical adhesive 112 is, for instance, transparent colloids having a certain degree of light transmittance, and may have the same material as the transparent colloids used in the diffusion adhesive 108, wherein since the diffusion adhesive 108 further includes a plurality of diffusion particles, the light transmittance of the optical adhesive 112 is higher than the overall light transmittance of the diffusion adhesive 108. Of course, the disclosure is not limited thereto. The material of the optical adhesive 112 may also be different from the material of the transparent colloids of the diffusion adhesive 108. Since the light transmittance of the optical adhesive 112 is greater than the light transmittance of the diffusion adhesive 108, the transparency of the display panel 100b may be further increased.

In the present embodiment, an area A3 occupied by the diffusion adhesive 108 is 200 $\mu m^2$-0.5 $mm^2$ and a ratio of A3 to A1 is 6%-65%. Specifically, using a full HD display as example, when the size of the pixel regions U is (630×630) µm² and the size of the light-emitting devices 106 is (20×20) µm², the desired brightness for display may be provided. The ratio is set according to the standard for retina display, wherein the optimal ratio is related to the pitch of the pixel regions U. In terms of a viewing distance of 40 cm, when the distance between two light spots is less than 116 the human eye cannot distinguish the two light spots (commonly known as the retina display). In this instance, the ratio of A3 to A1 is preferably 65%(((630−116)/630)2≈65%). In terms of a viewing distance of 1 m, when the distance between the two light spots is less than 291 µm, the human eye cannot distinguish the two light spots. In this instance, the ratio of A3 to A1 is preferably 28%(((630−291)/630)2≈28%).

Third Embodiment

Figure 4:
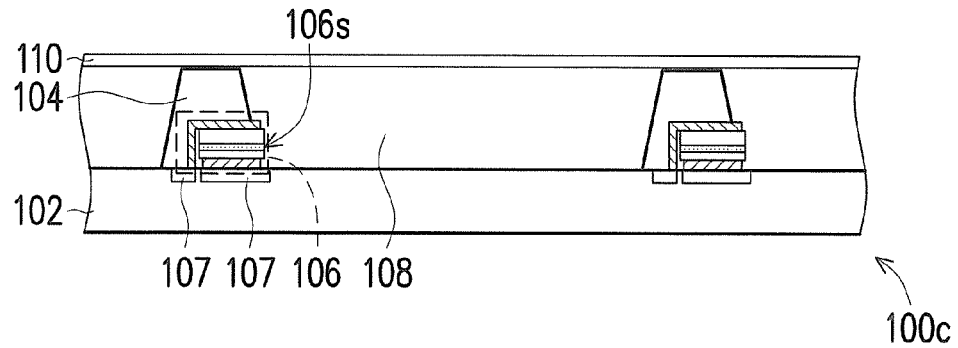
FIG. 4 is a schematic cross-sectional view of a portion of a display panel of the third embodiment of the disclosure.

FIG. 4 is a schematic cross-sectional view of a portion of a display panel of the third embodiment of the disclosure. Referring to FIG. 1 and FIG. 4, the display panel 100c is substantially similar to the display panel 100a of FIG. 2A, wherein the difference between the two is that the light-emitting devices 106 of the display panel 100c are partially disposed in the meshed shielding pattern 104. In other words, the light-emitting devices 106 are partially embedded in the meshed shielding pattern 104. The meshed shielding pattern 104 covers the light-emitting devices 106 and exposes a side 106s of the light-emitting devices 106. In the present embodiment, the light-emitting devices 106 provide a light source by emitting light from the side. Specifically, when the meshed shielding pattern 104 covers the light-emitting devices 106 such that the light-emitting devices 106 emit light from the side 106s, a reflective material may further be disposed in the light-emitting devices 106, and the reflective material is, for instance, disposed between the light-emitting devices 106 and the meshed shielding pattern 104 such that light is primarily emitted from the side 106s after being reflected by the reflective material.

When the meshed shielding pattern 104 completely covers the light exit surface of the light-emitting devices 106 except for the side 106s, the area A2 occupied by the light-emitting devices 106 is substantially zero, and therefore, the ratio of A2 to A1 is substantially zero. Moreover, the disclosure is not limited thereto. The meshed shielding pattern 104 may also only partially cover the light-emitting devices 106 such that the meshed shielding pattern 104 exposes the light exit surface of the light-emitting devices 106 except for the side 106s. In this instance, the area A2 occupied by the light-emitting devices 106 is substantially not zero.

Fourth Embodiment

Figure 5:
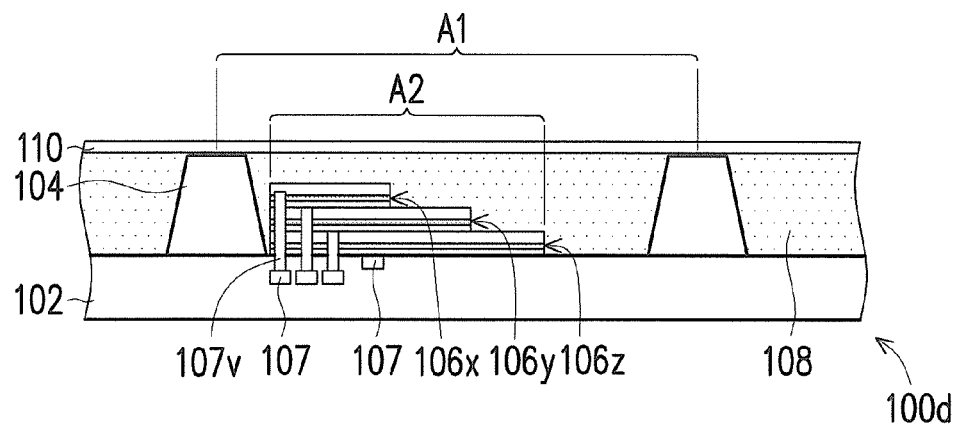
FIG. 5 is a schematic cross-sectional view of a portion of a display panel of the fourth embodiment of the disclosure.

FIG. 5 is a schematic cross-sectional view of a portion of a display panel of the fourth embodiment of the disclosure. Referring to FIG. 1 and FIG. 5, the display panel 100d is substantially similar to the display panel 100a of FIG. 2A, wherein the difference between the two is that three light-emitting devices are disposed in the pixel regions U of the display panel 100d. Specifically, light-emitting devices 106x, 106y, and 106z are stacked upon one another and each light-emitting device is at least partially exposed. For instance, since the light-emitting device 106y is stacked upon the light-emitting device 106z, the light-emitting device 106z is only partially exposed. Similarly, since the light-emitting device 106x is stacked upon the light-emitting device 106y, the light-emitting device 106y is only partially exposed. Moreover, the light-emitting device 106x is completely exposed. In the present embodiment, the light-emitting devices 106x, 106y, and 106z are respectively a red light-emitting device, a green light-emitting device, and a blue light-emitting device, and the same pixel region U may display three different colors. Therefore, the display panel 100d has higher resolution. Of course, the disclosure is not limited thereto, and those skilled in the art may design the colors of the light-emitting devices on their own based on need. The light-emitting device 106x, the light-emitting device 106y, and the light-emitting device 106z are electrically connected to the circuit layer 107 on the substrate 102 through a conductive via 107v.

Fifth Embodiment

Figure 6:
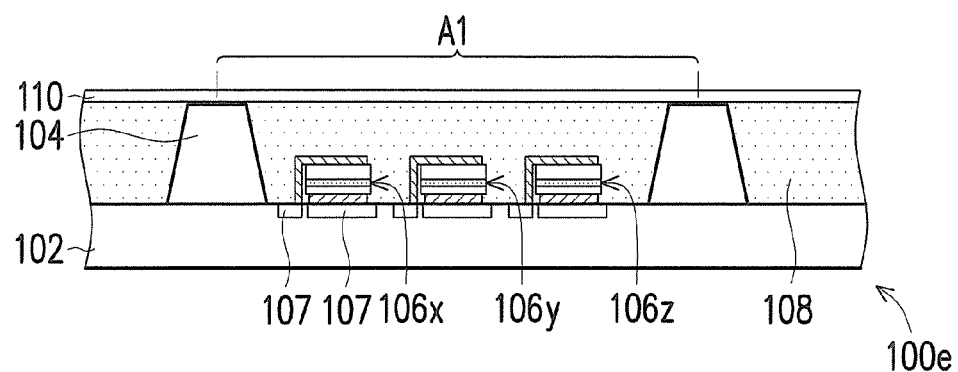
FIG. 6 is a schematic cross-sectional view of a portion of a display panel of the fifth embodiment of the disclosure.

FIG. 6 is a schematic cross-sectional view of a portion of a display panel of the fifth embodiment of the disclosure. Referring to FIG. 1 and FIG. 6, the display panel 100e is substantially similar to the display panel 100d of FIG. 5, wherein the difference between the two is that a plurality of light-emitting devices 106x, 106y, and 106z separate from one another are disposed in the pixel regions U of the display panel 100e. Specifically, the light-emitting devices 106x, 106y, and 106z are, for instance, disposed separately from one another, and each light-emitting device is completely exposed. In the present embodiment, the light-emitting devices 106x, 106y, and 106z are respectively a red light-emitting device, a green light-emitting device, and a blue light-emitting device, and the same pixel region U may display three different colors. Therefore, the display panel 100d has higher resolution. Of course, the disclosure is not limited thereto, and those skilled in the art may design the colors of the light-emitting devices on their own based on need.

Sixth Embodiment

Figure 7:
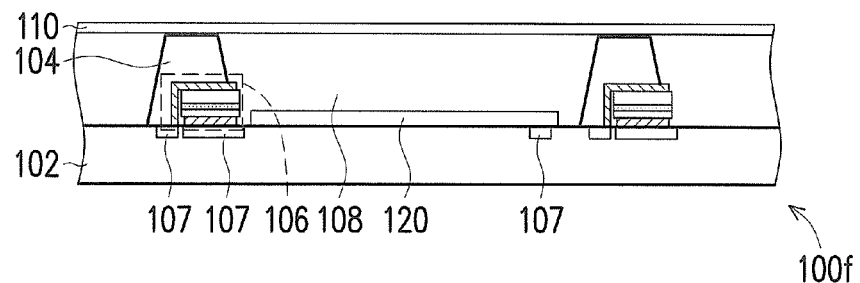
FIG. 7 is a schematic cross-sectional view of a portion of a display panel of the sixth embodiment of the disclosure.

FIG. 7 is a schematic cross-sectional view of a portion of a display panel of the sixth embodiment of the disclosure. Referring to FIG. 1 and FIG. 7, the display panel 100f is substantially similar to the display panel 100c of FIG. 4, wherein the difference between the two is that the display panel 100f further includes a plurality of solar cells 120 electrically connected to the circuit layer 107. Specifically, at least one solar cell 120 of the solar cells 120 is disposed in each pixel region U of the pixel regions U, wherein the solar cells 120 have a certain degree of inherent light transmittance. Moreover, when the solar cells 120 are in operation to absorb light, the degree of direct penetration by the light may be reduced. Therefore, grayscale control may be achieved such that the display panel 100f may have a better quality of deep color display. Moreover, after the solar cells 120 absorb light, power may be generated, wherein the power may, after treatment, be provided to the light-emitting devices 106 of the display panel 100f for use and reduce additional energy needed for the display panel 100f. Moreover, the present embodiment is exemplified by disposing the solar cells 120 in the display panel 100c. However, the disclosure is not limited thereto. In other embodiments, the solar cells 120 may also be integrated into the design of the display panels 100a and 100b.

Figure 8:
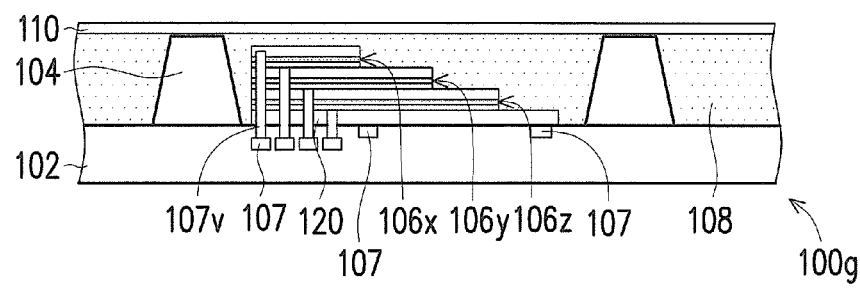
FIG. 8 is a schematic cross-sectional view of a portion of a display panel of the seventh embodiment of the disclosure.

FIG. 8 is a schematic cross-sectional view of a portion of a display panel of the seventh embodiment of the disclosure. Referring to FIG. 1 and FIG. 8, the display panel 100g is substantially similar to the display panel 100d of FIG. 6, wherein the difference between the two is that the display panel 100g further includes a plurality of solar cells 120 electrically connected to the circuit layer 107. At least one solar cell 120 of the solar cells 120 is disposed in each pixel region U of the pixel regions U, and the light-emitting devices 106x, 106y, and 106z stacked upon one another are disposed on the solar cells 120. Therefore, the light-emitting devices 106x, 106y, and 106z and the solar cells 120 are stacked upon one another. In the present embodiment, the light-emitting devices 106x, 106y, and 106z are stacked upon the solar cells 120, and the disclosure does not limit the stacking sequence of the light-emitting devices 106x, 106y, and 106z and the solar cells 120. Moreover, in other embodiments, the light-emitting devices 106x, 106y, and 106z stacked upon one another may also be disposed separately from the solar cells 120. In other words, the light-emitting devices 106x, 106y, and 106z and the solar cells 120 are not stacked upon one another.

Eighth Embodiment

Figure 9:
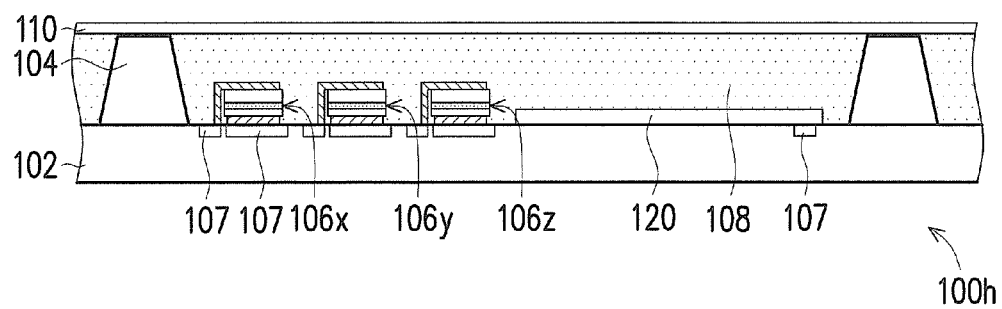
FIG. 9 is a schematic cross-sectional view of a portion of a display panel of the eighth embodiment of the disclosure.

FIG. 9 is a schematic cross-sectional view of a portion of a display panel of the eighth embodiment of the disclosure. Referring to FIG. 1 and FIG. 9, the display panel 100h is substantially similar to the display panel 100e of FIG. 6, wherein the difference between the two is that the display panel 100h further includes a plurality of solar cells 120 electrically connected to the circuit layer 107. At least one solar cell 120 of the solar cells 120 is disposed in each pixel region U of the pixel regions U. The light-emitting devices 106x, 106y, and 106z separate from one another are separate from the solar cells and are not stacked with the solar cells. Moreover, in other embodiments, the light-emitting devices 106x, 106y, and 106z separate from one another may also be stacked with the solar cells 120, wherein all of the light-emitting devices may be disposed on the solar cells 120, or a portion of the light-emitting devices may be disposed on the solar cells 120.

Ninth Embodiment

Figure 10:
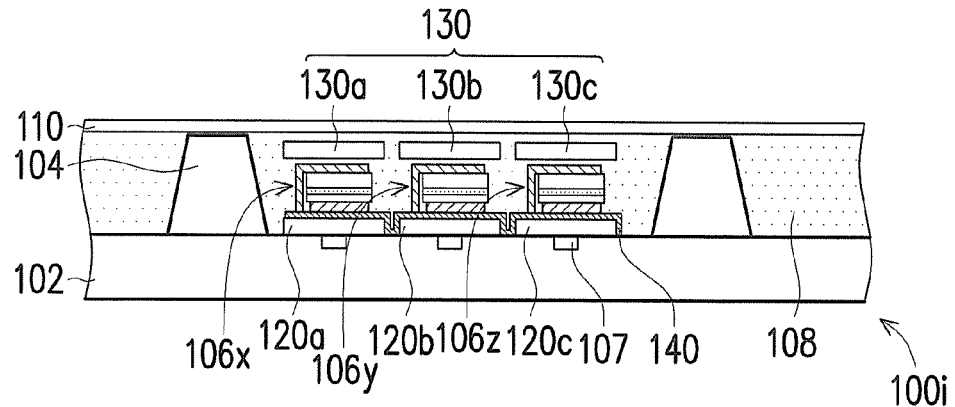
FIG. 10 is a schematic cross-sectional view of a portion of a display panel of the ninth embodiment of the disclosure.

FIG. 10 is a schematic cross-sectional view of a portion of a display panel of the ninth embodiment of the disclosure. Referring to FIG. 1 and FIG. 10, the display panel 100i is substantially similar to the display panel 100h of FIG. 9, wherein the difference between the two is that three solar cells 120a, 120b, and 120c are disposed in each pixel region U of the pixel regions U of the display panel 100i. The light-emitting devices 106x, 106y, and 106z are respectively disposed on the solar cells 120a, 120b, and 120c. Moreover, the display panel 100i further includes a color filter pattern 130. The color filter pattern 130 covers the light-emitting devices 106x, 106y, 106z and the solar cells 120a, 120b, 120c. The color filter pattern 130 includes first filter patterns 130a, 130b, and 130c, wherein the first filter patterns 130a, 130b, and 130c are, for instance, respectively a red filter pattern, a green filter pattern, and a blue filter pattern. The first filter patterns 130a, 130b, and 130c respectively cover the light-emitting devices 106x, 106y, and 106z and the solar cells 120a, 120b, and 120c.

As shown in FIG. 10, the solar cells 120a, 120b, and 120c and the light-emitting devices 106x, 106y, and 106z are all electrically connected to the third electrode 140. When the solar cells 120a, 120b, and 120c are in operation, the solar cells 120a, 120b, and 120c may respectively absorb the light passing through the first filter patterns 130a, 130b, and 130c to generate power. In other words, the solar cells 120a, 120b, and 120c may respectively detect red, green, and blue lights and generate electrical signals. Therefore, the display panel 100i further has the function of color image sensing, such as the function of color scanning.

Tenth Embodiment

Figure 11:
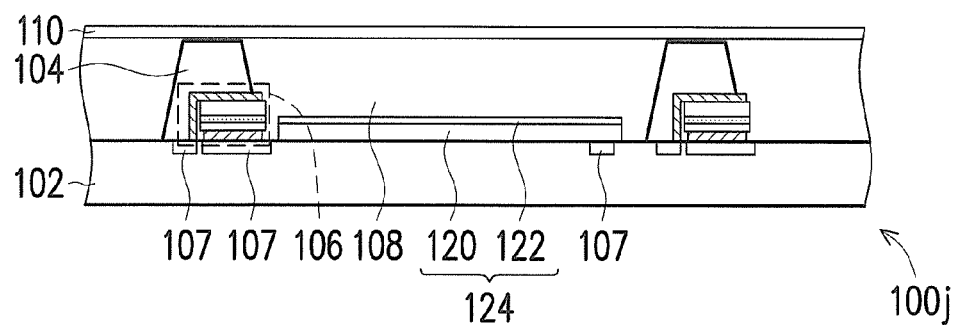
FIG. 11 is a schematic cross-sectional view of a portion of a display panel of the tenth embodiment of the disclosure.

FIG. 11 is a schematic cross-sectional view of a portion of a display panel of the tenth embodiment of the disclosure. Referring to FIG. 1 and FIG. 11, the display panel 100j is substantially similar to the display panel 100f of FIG. 7, wherein the difference between the two is that the display panel 100j further includes a plurality of electrochromic material layers 122. At least one electrochromic material layer 122 of the electrochromic material layers 122 is disposed in each pixel region U of the pixel regions U. The electrochromic material layers 122 are disposed on the solar cells 122, and the electrochromic material layers 122 and the solar cells 120 jointly form an electrochromic cell 124.

Specifically, in the electrochromic cell 124, a layer of electrochromic material layer 122 is, for instance, disposed on the transparent electrodes of the solar cells 120, wherein the electrochromic material layer 122 is, for instance, a substantially transparent tungsten oxide ($WO_3$) thin film, and the solar cells 120 are, for instance, dye-sensitized solar cells containing lithium-ion solid electrolyte. When the electrochromic cell 124 absorbs light and is in an open state with the external circuit, the current generated by the solar cells 120 are injected into the $WO_3$ thin film such that $WO_3$ is oxidized and forms the colored lithium tungsten bronze ($Li_xWO_3$). Then, when the electrochromic cell 124 is in a connected state with the external circuit, $Li_xWO_3$ returns to the original state of transparent $WO_3$. In this way, grayscale control of the display panel 100j may be achieved by controlling the presence of color in the electrochromic cell 124 such that the display panel 100j has good display quality. Moreover, those skilled in the art may design the relationship of configuration between the electrochromic material layers 122 and the solar cells 120 based on need. The disclosure is not limited to disposing the electrochromic material layers 122 on the surface of the solar cells 120. In other words, as long as the current of the solar cells 120 is injected into the electrochromic material layers 122 to control the color of the electrochromic material layers 122, the disposition of the electrochromic material layers 122 falls within the desired scope of the disclosure to be protected.

Eleventh Embodiment

Figure 12:
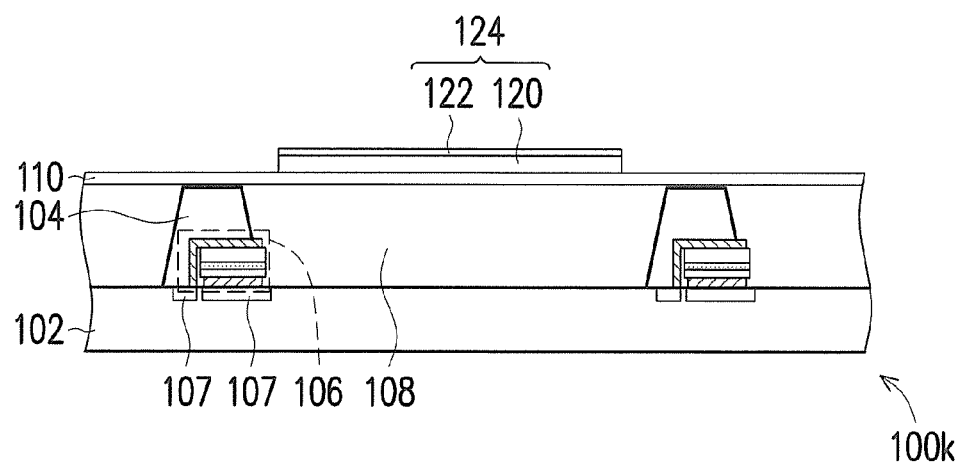
FIG. 12 is a schematic cross-sectional view of a portion of a display panel of the tenth embodiment of the disclosure.

FIG. 12 is a schematic cross-sectional view of a portion of a display panel of the eleventh embodiment of the disclosure. Referring to FIG. 1 and FIG. 12, the display panel 100k is substantially similar to the display panel 100j of FIG. 11, wherein the difference between the two is that the electrochromic cell 124 of the display panel 100k is disposed on the cover layer 110.

Based on the above, in the display panel of the disclosure, the ratio of the area of the light-emitting device to the area of the pixel region is relatively low, and therefore the transparency of the display panel may be increased. Moreover, solar cells are disposed in the display panel of the disclosure, and when the solar cells are in operation to absorb light, grayscale control of the display panel may be achieved so as to have a better quality of deep color display.

Twelfth Embodiment

Figure 13:
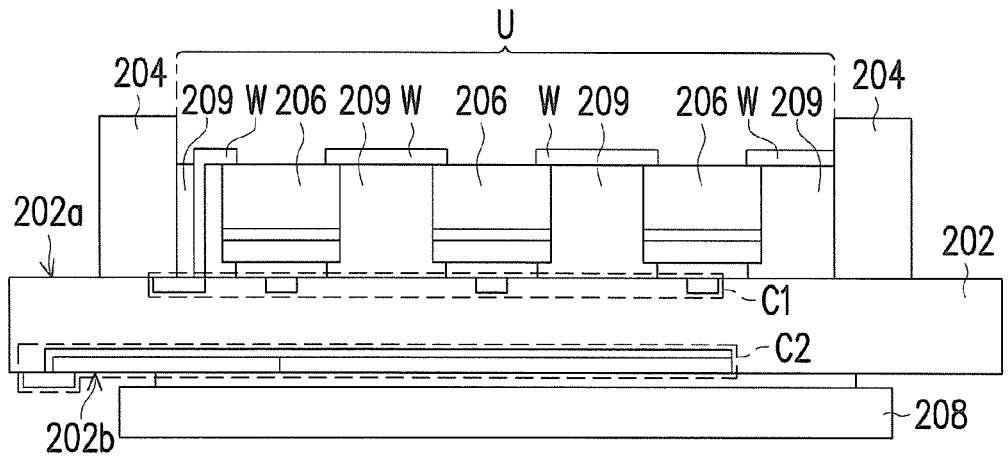
FIG. 13 is a schematic cross-sectional view of a portion of a display panel of the twelfth embodiment of the disclosure.

FIG. 13 is a schematic cross-sectional view of a portion of a display panel of the twelfth embodiment of the disclosure.

Referring to FIG. 13, the display panel 200 of this embodiment comprises a substrate 202, a meshed shielding pattern 204, a plurality of light-emitting devices 206 and a solar cell 208. The substrate 202 has a first surface 202a and a second surface 202b opposite to the first surface 202a, the substrate 202 comprises a first circuit layer C1 disposed over the first surface 202a and a second circuit layer C2 disposed over the second surface 202b. The meshed shielding pattern 204 is disposed on first surface 202a of the substrate 202 to define a plurality of pixel regions U over the substrate 202. The light-emitting devices 206 are disposed on the first surface 202a of the substrate 202 and electrically connected to the first circuit layer C1, and at least one of the light-emitting devices 206 is disposed in one of the pixel regions U. The solar cell 208 is disposed on the second surface 202b of the substrate 202 and electrically connected to the second circuit layer C2. In this embodiment, three light-emitting devices 206 capable of emitting different color light (e.g. red light, green light and a blue light) are arranged within one pixel region U. The light-emitting devices 206 arranged within one pixel unit U and capable of respectively emitting red light, green light and a blue light can be defined as a display dot of the display panel 200. However, the disclosure does not limit thereto.

The substrate 202 is, for example, a transparent substrate. The transparent substrate 202 has a light transmittance above a certain degree, and the higher the light transmittance, the higher the transparency of the substrate 202. The substrate 202 may be a rigid substrate or a flexible substrate. The material of the rigid substrate is, for instance, glass, quartz, or silicon wafer. The material of the flexible substrate is, for instance, plastic. Moreover, the first circuit layer C1 and the second circuit layer C2 having predetermined designs may be respectively formed over the first surface 202a and the second surface 202b of the substrate 202 or may be integrated into the interior of the substrate 202. In this embodiment, the substrate 202 comprising the first circuit layer C1 may be a thin film transistor (TFT) array substrate. For example, the first circuit layer C1 formed over the substrate 202 comprises scan lines, data lines, transistors and pixel electrodes, wherein each of the pixel electrodes is electrically connected to one of the scan lines and one of the data lines through one of the transistors correspondingly, and the light-emitting devices 206 are electrically connected to the pixel electrodes. In other words, the first circuit layer C1 controls the light-emitting devices 206 so as to display images. However, the substrate 202 is not limited to the thin film transistor (TFT) array substrate. Other types of circuit substrates (e.g. printed circuit boards) having the first circuit layer C1 and the second circuit layer C2 formed thereon may also be used in this embodiment.

The meshed shielding pattern 204 is disposed on the substrate 202. The meshed shielding pattern 204 has a grid structure so as to define a plurality of pixel regions U on the substrate 202. The material of the meshed shielding pattern 204 may be, for instance, an organic polymer material, a photoresist, a metal, a dielectric material, an oxide, or a semiconductor.

As shown in FIG. 13, the second circuit layer C2 formed over the second surface 202b of the substrate 202 is, for example, a control circuit for driving the solar cell 208 and storing the electrical energy generated from the solar cell 208. Furthermore, the second circuit layer C2 may output the electrical energy generated from the solar cell 208 to the first circuit layer C1 and the light-emitting devices 206 may use the electrical energy generated from the solar cell 20. Due to the contribution of the electrical power from the solar cell 208, power consumption of the display panel 200 can be lowered. The electrical connection between the first circuit layer C1 and the second circuit layer C2 may be achieved by conductive through vias (not shown) formed in the substrate 202, a flexible printed circuit (FPC) bonded with the first circuit layer C1 and the second circuit layer C2 and so on.

As shown in FIG. 13, the display panel 200 of this embodiment may further comprise a dielectric layer 209 filled in the pixel regions U. The light-emitting devices 206 are protected and encapsulated by the dielectric layer 209. For example, the dielectric layer 209 may be an optical adhesive or a diffusion adhesive. Furthermore, the display panel 200 may further comprise a connection wiring W, wherein the light-emitting devices 206 may electrically connect to connection wiring W. For example, all the light-emitting devices 206 are electrically connected to a common voltage source (Vcom) through the connection wiring W. It is noted that the connection wiring W is an optional element in display panel 200, one ordinary skilled in the art may omit the connection wiring W.

Thirteenth Embodiment

Figure 14:
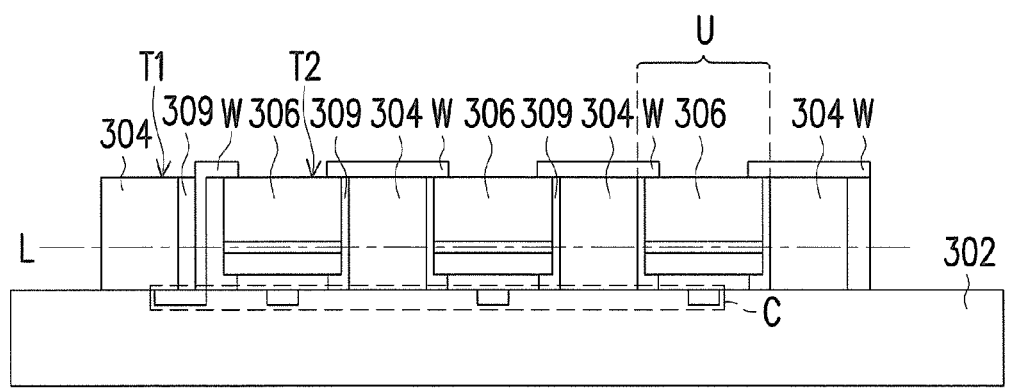
FIG. 14 is a schematic cross-sectional view of a portion of a display panel of the thirteenth embodiment of the disclosure.

FIG. 14 is a schematic cross-sectional view of a portion of a display panel of the thirteenth embodiment of the disclosure. Referring to FIG. 14, the display panel 300 of this embodiment comprises a substrate 302, a meshed shielding pattern 304 and a plurality of light-emitting devices 306. The substrate 302 comprises a circuit layer C. The meshed shielding pattern 304 is disposed on the substrate 302 to define a plurality of pixel regions U over the substrate 302. The light-emitting devices 306 are disposed on the substrate 302 and electrically connected to the circuit layer C, and at least one of the light-emitting devices 306 is disposed in one of the pixel regions U. The meshed shielding pattern 304 is capable of converting light emitted from the light-emitting devices 306 into photo-current. In this embodiment, the meshed shielding pattern 304 is a meshed solar cell, for example, for absorbing light emitted from the light-emitting devices 306 and generating photo-current.

The substrate 302 is, for example, a transparent substrate. The transparent substrate 302 has a light transmittance above a certain degree, and the higher the light transmittance, the higher the transparency of the substrate 302. The substrate 302 may be a rigid substrate or a flexible substrate. The material of the rigid substrate is, for instance, glass, quartz, or silicon wafer. The material of the flexible substrate is, for instance, plastic. Moreover, the circuit layer C having predetermined designs may be formed over one surface of the substrate 302 or may be integrated into the interior of the substrate 302. In this embodiment, the substrate 302 comprising the circuit layer C may be a thin film transistor (TFT) array substrate. For example, the circuit layer C formed over the substrate 302 comprises scan lines, data lines, transistors and pixel electrodes, wherein each of the pixel electrodes is electrically connected to one of the scan lines and one of the data lines through one of the transistors correspondingly, and the light-emitting devices 306 are electrically connected to the pixel electrodes. Furthermore, the circuit layer C may drive the meshed shielding pattern 304 and store the electrical energy generated from the meshed shielding pattern 304. Due to the contribution of the electrical power from the meshed shielding pattern 304, power consumption of the display panel 300 can be lowered. In other words, the circuit layer C controls both light output of the light-emitting devices 306 and operation of the meshed shielding pattern 304 (i.e. the meshed solar cell). However, the substrate 302 is not limited to the thin film transistor (TFT) array substrate. Other types of circuit substrates (e.g. printed circuit boards) having the circuit layer C formed thereon may also be used in this embodiment.

In this embodiment, three light-emitting devices 306 capable of emitting different color light (e.g. red light, green light and a blue light) are respectively arranged within three individual pixel regions U. Different color lights emitted from light-emitting devices 306 are absorbed by the meshed shielding pattern 304. However, the disclosure does not limit thereto. The light-emitting devices 306 capable of respectively emitting red light, green light and a blue light can be defined as a display dot of the display panel 300.

As shown in FIG. 14, each of the light-emitting devices 306 comprises a light-emitting layer EL located at a horizontal level L, and a top surface T1 of the meshed shielding pattern 304 is higher than the horizontal level L. In this case, the light emitted from the light-emitting devices 306 can be sufficiently absorbed and blocked by the meshed shielding pattern 304. Furthermore, the top surface T1 of the meshed shielding pattern 304 substantially aligns with top surfaces T2 of the light-emitting devices 306.

As shown in FIG. 14, the display panel 300 of this embodiment may further comprise a dielectric layer 309 filled in the pixel regions U. The light-emitting devices 306 and the meshed shielding pattern 304 are protected and encapsulated by the dielectric layer 309. For example, the dielectric layer 309 may be an optical adhesive or a diffusion adhesive. Furthermore, the display panel 300 may further comprises a connection wiring W, wherein the light-emitting devices 306 may electrically connect to the connection wiring W. It is noted that the connection wiring W is an optional element in display panel 300, one ordinary skilled in the art may omit the connection wiring W.

Fourteenth Embodiment

Figure 15:
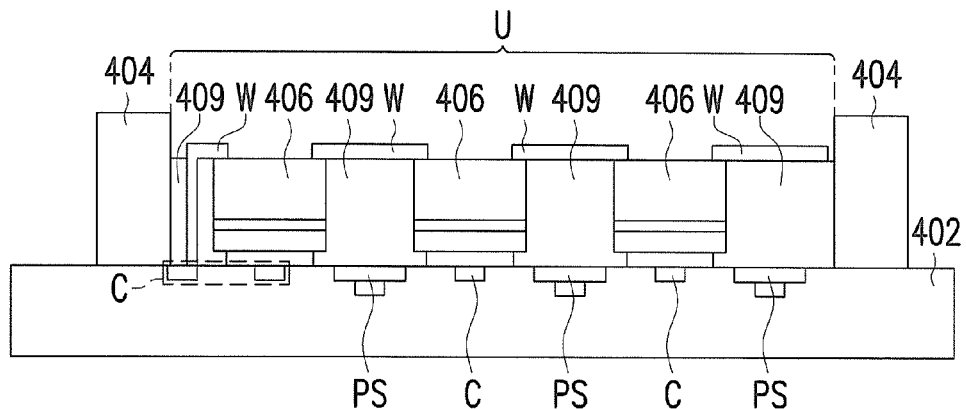
FIG. 15 is a schematic cross-sectional view of a portion of a display panel of the fourteenth embodiment of the disclosure.

FIG. 15 is a schematic cross-sectional view of a portion of a display panel of the fourteenth embodiment of the disclosure. Referring to FIG. 15, the display panel 400 of this embodiment comprises a substrate 402, a meshed shielding pattern 404 and a plurality of light-emitting devices 406. The substrate 402 comprises a circuit layer C and a plurality of photo-sensors PS. The meshed shielding pattern 404 is disposed on the substrate 402 to define a plurality of pixel regions U over the substrate 402. The light-emitting devices 406 are disposed on the substrate 402 and electrically connected to the circuit layer C, and at least one of the light-emitting devices 406 is disposed in one of the pixel regions U. The photo-sensors PS are capable of detecting light emitted from the light-emitting devices 406 to monitor light output of the light-emitting devices 406.

The substrate 402 is, for example, a transparent substrate. The transparent substrate 402 has a light transmittance above a certain degree, and the higher the light transmittance, the higher the transparency of the substrate 402. The substrate 402 may be a rigid substrate or a flexible substrate. The material of the rigid substrate is, for instance, glass, quartz, or silicon wafer. The material of the flexible substrate is, for instance, plastic. Moreover, the circuit layer C having predetermined designs may be formed over one surface of the substrate 402 or may be integrated into the interior of the substrate 402. In this embodiment, the substrate 402 comprising the circuit layer C may be a thin film transistor (TFT) array substrate. For example, the circuit layer C formed over the substrate 402 comprises scan lines, data lines, transistors and pixel electrodes, wherein each of the pixel electrodes is electrically connected to one of the scan lines and one of the data lines through one of the transistors correspondingly. Furthermore, the light-emitting devices 406 and the photo-sensors PS are electrically connected to the pixel electrodes correspondingly. The circuit layer C may drive the light-emitting devices 406 and readout the detection result of the photo-sensors PS. Specifically, the photo-sensors PS detect the light emitted from the light-emitting devices 406 and feedback the detection result to stabilize light output of the light-emitting devices 406. Due to the feedback of the detection result from the photo-sensors PS, reliability of the display panel 400 can be improved. In other words, the circuit layer C not only controls light output of the light-emitting devices 306, but also readouts the detection result of the photo-sensors PS to stabilize light output of the light-emitting devices 406. However, the substrate 402 is not limited to the thin film transistor (TFT) array substrate. Other types of circuit substrates (e.g. printed circuit boards) having the circuit layer C formed thereon may also be used in this embodiment.

The meshed shielding pattern 404 is disposed on the substrate 402. The meshed shielding pattern 404 has a grid structure so as to define a plurality of pixel regions U on the substrate 402. The material of the meshed shielding pattern 404 may be, for instance, an organic polymer material, a photoresist, a metal, a dielectric material, an oxide, or a semiconductor.

In this embodiment, three light-emitting devices 406 capable of emitting different color lights (e.g. red light, green light and a blue light) and three photo-sensors PS (e.g. a first photo-sensor for detecting intensity of red light, a second photo-sensor for detecting intensity of green light and a third photo-sensor for detecting intensity of blue light) are arranged within one pixel region U. The light-emitting devices 206 arranged within one pixel unit U and capable of respectively emitting red light, green light and a blue light can be defined as a display dot of the display panel 200. However, the disclosure does not limit thereto. In other words, two light-emitting devices 406 capable of emitting different color lights (e.g. first light and second light) and two photo-sensors PS (e.g. a first photo-sensor for detecting intensity of the first light and a second photo-sensor for detecting intensity of the second light) arranged within one pixel region U may also be used in this embodiment. The disclosure does not limit the number of the light-emitting devices 406 and the number of the photo-sensors PS.

As shown in FIG. 15, the display panel 400 of this embodiment may further comprise a dielectric layer 409 filled in the pixel regions U. The light-emitting devices 406 are protected and encapsulated by the dielectric layer 409. For example, the dielectric layer 409 may be an optical adhesive or a diffusion adhesive. Furthermore, the display panel 400 may further comprise a connection wiring W, wherein the light-emitting devices 406 may electrically connect to connection wiring W. For example, all the light-emitting devices 406 are electrically connected to a common voltage source (Vcom) through the connection wiring W. It is noted that the connection wiring W is an optional element in display panel 400, one ordinary skilled in the art may omit the connection wiring W.

Fifteenth Embodiment

Figure 16:
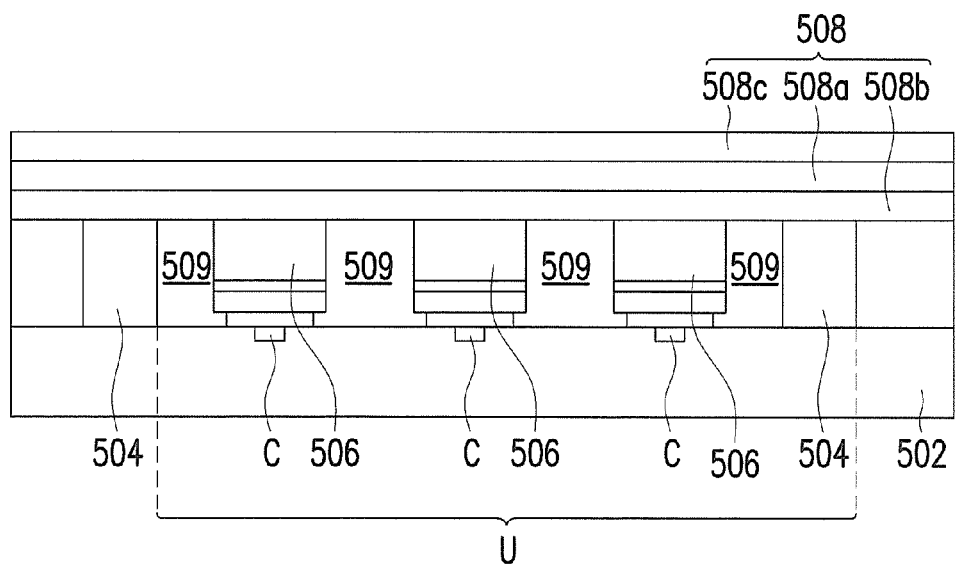
FIG. 16 is a schematic cross-sectional view of a portion of a display panel of the fifteenth embodiment of the disclosure.

FIG. 16 is a schematic cross-sectional view of a portion of a display panel of the fifteenth embodiment of the disclosure. Referring to FIG. 16, the display panel 500 of this embodiment comprises a substrate 502, a meshed shielding pattern 504, a dielectric layer 509, a plurality of light-emitting devices 506 and a touch-sensing layer 508. The substrate 502 comprises a circuit layer C. The meshed shielding pattern 504 is disposed on the substrate 502 to define a plurality of pixel regions U over the substrate 502. The dielectric layer 509 is filled in the pixel regions U. The light-emitting devices 506 are disposed on the substrate 502 and electrically connected to the circuit layer C, at least one of the light-emitting devices 506 is disposed in one of the pixel regions U, and the light-emitting devices 506 are encapsulated by the dielectric layer 509. The touch-sensing layer 508 is disposed over the dielectric layer 509 and the light-emitting devices 506.

The substrate 502 is, for example, a transparent substrate. The transparent substrate 502 has a light transmittance above a certain degree, and the higher the light transmittance, the higher the transparency of the substrate 502. The substrate 502 may be a rigid substrate or a flexible substrate. The material of the rigid substrate is, for instance, glass, quartz, or silicon wafer. The material of the flexible substrate is, for instance, plastic. Moreover, the circuit layer C having predetermined designs may be formed over one surface of the substrate 502 or may be integrated into the interior of the substrate 502. In this embodiment, the substrate 502 comprising the circuit layer C may be a thin film transistor (TFT) array substrate. For example, the circuit layer C formed over the substrate 502 comprises scan lines, data lines, transistors and pixel electrodes, wherein each of the pixel electrodes is electrically connected to one of the scan lines and one of the data lines through one of the transistors correspondingly, and the light-emitting devices 506 are electrically connected to the pixel electrodes. Furthermore, the circuit layer C may electrically connect to the touch-sensing layer 508 and read-out touch-sensing signal generated from the touch-sensing layer 508. Due to the integration of the light-emitting devices 506 and the touch-sensing layer 508, the display panel 500 can be classified as a touch-sensing display panel. However, the substrate 502 is not limited to the thin film transistor (TFT) array substrate. Other types of circuit substrates (e.g. printed circuit boards) having the circuit layer C formed thereon may also be used in this embodiment.

In this embodiment, three light-emitting devices 506 capable of emitting different color light (e.g. red light, green light and a blue light) are arranged within one pixel region U. The light-emitting devices 506 arranged within one pixel unit U and capable of respectively emitting red light, green light and a blue light can be defined as a display dot of the display panel 500. However, the disclosure does not limit thereto.

As shown in FIG. 16, the light-emitting devices 506 and the meshed shielding pattern 504 are protected and encapsulated by the dielectric layer 509. For example, the dielectric layer 509 may be an optical adhesive or a diffusion adhesive.

The touch-sensing layer 508 of this embodiment may be a capacitive type touch-sensing device or a resistive type touch-sensing device. The touch-sensing layer 508 is formed over the light-emitting devices 506 and the dielectric layer 509 by thin film processes. Taking the capacitive type touch-sensing device as an example, the touch-sensing layer 508 of this embodiment comprises an insulating layer 508a, a plurality of first sensing series 508b and a plurality of second sensing series 508c. The insulating layer 508a is sandwiched between the first sensing series 508b and the second sensing series 508c such that the first sensing series 508b and the second sensing series 508c are electrically insulated from each another.

Based on the above (i.e. the twelfth embodiment through the fifteenth embodiment), power consumption of the display panel having a solar cell integrated therein is lowered. Additionally, reliability of the display panel having photo-sensors integrated therein is enhanced.

It will be apparent to those skilled in the art that various modifications and variations can be made to the structure of the disclosed embodiments without departing from the scope or spirit of the disclosure. In view of the foregoing, it is intended that the disclosure cover modifications and variations of this specification provided they fall within the scope of the following claims and their equivalents.

What is claimed is:

1. A display panel, comprising:
   a substrate having a first surface and a second surface opposite to the first surface, the substrate comprising a first circuit layer disposed over the first surface and a second circuit layer disposed over the second surface;
   a meshed shielding pattern disposed on first surface of the substrate to define a plurality of pixel regions over the substrate;
   a plurality of light-emitting devices disposed on the first surface of the substrate and electrically connected to the first circuit layer, and at least one of the light-emitting devices being disposed in one of the pixel regions; and
   a photoelectric device for converting light into electricity, the photoelectric device being disposed on the at least one of the first surface and the second surface of the substrate and electrically connected to the second circuit layer.

2. The display panel of claim 1 further comprising a dielectric layer filled in the pixel regions, wherein the light-emitting devices are encapsulated by the dielectric layer.

3. The display panel of claim 2, wherein the dielectric layer comprises an optical adhesive or a diffusion adhesive.

4. The display panel of claim 1 further comprising a connection wiring, wherein the light-emitting devices are electrically connected to the connection wiring.

5. The display panel of claim 1, wherein the photoelectric device comprises a solar cell or a photo-sensor.

6. A display panel, comprising:
   a substrate comprising a circuit layer;
   a meshed shielding pattern disposed on the substrate to define a plurality of pixel regions over the substrate; and
   a plurality of light-emitting devices disposed on the substrate and electrically connected to the circuit layer, and at least one of the light-emitting devices being disposed in one of the pixel regions, wherein the meshed shielding pattern comprises a meshed photoelectric device for converting light into electricity.

7. The display panel of claim 6, wherein the meshed photoelectric device comprises a meshed solar cell.

8. The display panel of claim 6, wherein each of the light-emitting devices comprises a light-emitting layer, the light-emitting layer being located at a horizontal level, and a top surface of the meshed shielding pattern being higher than the horizontal level.

9. The display panel of claim 6, wherein a top surface of the meshed shielding pattern aligns with top surfaces of the light-emitting devices.

10. The display panel of claim 6 further comprising a dielectric layer filled in the pixel regions, wherein the light-emitting devices are encapsulated by the dielectric layer.

11. The display panel of claim 10, wherein the dielectric layer comprises an optical adhesive or a diffusion adhesive.

12. The display panel of claim 6 further comprising a connection wiring, wherein the light-emitting devices are electrically connected to the connection wiring.

13. The display panel of claim 6, further comprising a touch-sensing layer disposed over the light-emitting devices.

14. A display panel, comprising:
- a substrate comprising a circuit layer and a plurality of photoelectric devices;
- a meshed shielding pattern disposed on the substrate to define a plurality of pixel regions over the substrate; and
- a plurality of light-emitting devices disposed on the substrate and electrically connected to the circuit layer, and at least one of the light-emitting devices being disposed in one of the pixel regions, wherein the photoelectric devices are configured to receive light output of the light-emitting devices, the light-emitting devices comprises a first light-emitting device for emitting a first light and a second light-emitting device for emitting a second light, and the photoelectric devices comprises a first photoelectric device for receiving the first light and a second photoelectric device for receiving the second light.

15. The display panel of claim 14 further comprising a dielectric layer filled in the pixel regions, wherein the light-emitting devices are encapsulated by the dielectric layer.

16. The display panel of claim 15, wherein the dielectric layer comprises an optical adhesive or a diffusion adhesive.

17. The display panel of claim 15 further comprising a connection wiring, wherein the light-emitting devices are electrically connected to the connection wiring.

18. The display panel of claim 14, further comprising a touch-sensing layer disposed over the light-emitting devices.

19. The display panel of claim 14, wherein the photoelectric devices are integrated into the interior of the substrate.

20. A display panel, comprising:
- a substrate comprising a circuit layer and a plurality of photoelectric devices;
- a meshed shielding pattern disposed on the substrate to define a plurality of pixel regions over the substrate; and
- a plurality of light-emitting devices disposed on the substrate and electrically connected to the circuit layer, and at least one of the light-emitting devices being disposed in one of the pixel regions, wherein the photoelectric devices are integrated into the interior of the substrate and configured to receive light output of the light-emitting devices.

* * * * *